(12) United States Patent
Takenaka (10) Patent No.: US 7,938,550 B2
(45) Date of Patent: May 10, 2011

(54) LIGHT EMITTING DEVICE AND CAMERA-EQUIPPED CELLULAR PHONE INCORPORATING THE SAME

(75) Inventor: Yasuji Takenaka, Higashihiroshima (JP)

(73) Assignee: Sharp Kabushiki Kaisha, Osaka-shi (JP)

( * ) Notice: Subject to any disclaimer, the term of this patent is extended or adjusted under 35 U.S.C. 154(b) by 388 days.

(21) Appl. No.: 12/135,744

(22) Filed: Jun. 9, 2008

(65) Prior Publication Data

US 2008/0304262 A1    Dec. 11, 2008

(30) Foreign Application Priority Data

Jun. 7, 2007   (JP) .................. 2007-151921

(51) Int. Cl.
*G03B 15/02*   (2006.01)
(52) U.S. Cl. ............... 362/3; 362/11; 362/84; 362/231; 362/234; 362/276
(58) Field of Classification Search .............. 362/3, 11, 362/84, 231, 276, 800, 234, 253
See application file for complete search history.

(56) References Cited

U.S. PATENT DOCUMENTS

| 7,176,612 | B2* | 2/2007 | Omoto et al. ............ 313/487 |
| 2002/0191102 | A1* | 12/2002 | Yuyama et al. ............ 348/370 |
| 2004/0207313 | A1 | 10/2004 | Omoto et al. |
| 2004/0207749 | A1* | 10/2004 | Takenaka ............ 348/371 |
| 2005/0135079 | A1* | 6/2005 | Yin Chua et al. ............ 362/12 |
| 2006/0043879 | A1 | 3/2006 | Naitou |
| 2006/0099449 | A1* | 5/2006 | Amano et al. ............ 428/690 |
| 2006/0245194 | A1 | 11/2006 | Kikuchi et al. |

FOREIGN PATENT DOCUMENTS

JP    2004-327492 A    11/2004
JP    2006-295082      10/2006

* cited by examiner

*Primary Examiner* — Ali Alavi
*Assistant Examiner* — Mary Zettl
(74) *Attorney, Agent, or Firm* — Morrison & Foerster LLP (57) ABSTRACT

A light emitting device includes: a first and second LED chips for emitting light with a first and second wavelengths which are different from each other; and a translucent sealing resin for sealing the first and second LED chips; wherein the sealing resin contains a fluorescent material which is excited by light with the first wavelength but is not excited by light with the second wavelength, so that the light with the second wavelength and white light resulted from color mixture of the light with the first and second wavelengths and light emitted from the fluorescent material can be selectively emitted. The above light emitting device is adapted for a camera-equipped cellular phone.

10 Claims, 4 Drawing Sheets

LIGHT EMITTING DEVICE AND CAMERA-EQUIPPED CELLULAR PHONE INCORPORATING THE SAME

CROSS-REFERENCE TO RELATED APPLICATIONS

This application is related to Japanese patent application No. 2007-151921 filed on Jun. 7, 2007, whose priority is claimed under 35 USC §119, the disclosure of which is incorporated by reference in its entirety.

BACKGROUND OF THE INVENTION

1. Field of the Invention

The present invention relates to a light emitting device and a camera-equipped cellular phone incorporating the same and, more particularly, relates to a light emitting device employing light emitting elements such as light emitting diodes and a camera-equipped cellular phone incorporating the same as a secondary light source for use in photographing.

2. Description of Related Art

As a conventional technique relating to the present invention, there have been known light emitting devices which are mounted as secondary light sources in camera-equipped cellular phones and are structured to include a white LED and a blue LED mounted on a common substrate and include a common frame member covering the both LEDs for emitting white light and blue light, such that the white light is used as a secondary light source for use in photographing while the blue light is used as an incoming lamp (see for example, Japanese Unexamined Patent Publication No. 2006-295082).

Further, as another conventional technique relating to the present invention, there have been known light emitting devices structured to include a combination of a blue LED, a red LED and a green fluorescent material which is excited by blue light to emit green light, so that white light with an excellent color rendering characteristic is emitted with the two color chips (see for example, Japanese Unexamined Patent Publication No. 2004-327492).

In recent years, widespread use of camera-equipped cellular phones has been significantly advanced. Many of camera-equipped cellular phones incorporate a white-light emitting device employing light emitting diodes (LEDs) as a secondary light source to cope with photographing in dark places.

There are three main types of white-light emitting devices employing LEDs, as follows.

White-light emitting devices of the first type employ a combination of a blue LED and a YAG (yttrium aluminum garnet) based fluorescent material to cause color mixture of blue light and yellow light generated from the excited fluorescent material for emitting pseudo white light. However, such a pseudo white color has a poor color rendering characteristic due to the shortage of red components, which may induce a so-called "color seepage" phenomenon which biases the color shades of images created by photographing toward blue green colors in cases where the light emitting devices are used as secondary light sources.

White-light emitting devices of the second type employ a combination of LEDs for three colors of RGB to cause color mixture of the three colors of RGB for emitting white light.

White-light emitting devices of the third type employ a combination of a blue LED, a red LED and a green fluorescent material which is excited by blue light to emit green light, for causing color mixture of three colors of RGB with the two color chips for emitting white light.

Among white-light emitting devices of the aforementioned three types, those of the third type are capable of emitting white light with an excellent color rendering characteristic resulted from color mixture of three colors of RGB with a simple structure using LED chips for two colors and a fluorescent material. Therefore, it can be said that such white-light emitting devices of the third type are excellent in terms of mounting area and cost.

On the other hand, the recent widespread use of camera-equipped cellular phones has offered the function of photographing to cellular phones which are always carried, which have offered, to users, opportunities to photograph readily at various situations, regardless of time and place.

However, unfortunately, some users have conducted immoral acts such as secret photographing, by wrongly utilizing the advantage of readily photographing.

In order to prevent secret photographing and other acts, it is most important to improve the morals of users, but there is also a need for development of cellular phones capable of increasing the difficulty of secret photographing and the like.

In order to increase the difficulty of secret photographing, it is common practice to provide cellular phones structured to generate pseudo shutter sounds when their electronic shutters are pressed.

It is estimated that such pseudo shutter sounds have offered a certain effect of preventing secret photographing and the like, but such shutter sounds are cancelled in crowds in many cases. Therefore, there has been a need for further improvement in other respects than shutter sounds.

SUMMARY OF THE INVENTION

The present invention has been made in view of the aforementioned circumstances and aims at providing a light emitting device capable of emitting white light with an excellent color rendering characteristic suitable as a secondary light source for use in photographing and also capable of being effectively used for preventing secret photographing.

According to the present invention, there is provided a light emitting device including first and second LED chips for emitting light with first and second wavelengths which are different from each other, and a translucent sealing resin for sealing the first and second LED chips, wherein the sealing resin contains a fluorescent material which is excited by light with the first wavelength but is not excited by light with the second wavelength, so that the light emitting device is structured to be capable of selectively emitting light with the second wavelength and a white color resulted from color mixture of light with the first and second wavelengths and light emitted from the fluorescent material.

The light emitting device according to the present invention can give an alarm to surroundings by selectively emitting light with the second wavelength, thereby preventing secret photographing. Further, the light emitting device according to the present invention can provide a white color resulted from color mixture of light with the first and second wavelengths and light emitted from the fluorescent material, thereby emitting white light with an excellent color rendering characteristic.

DESCRIPTION OF THE PREFERRED EMBODIMENTS

A light emitting device according to the present invention includes first and second LED chips for emitting light with first and second wavelengths which are different from each other, and a translucent sealing resin for sealing the first and second LED chips, wherein the sealing resin contains a fluorescent material which is excited by light with the first wavelength but is not excited by light with the second wavelength, so that the light emitting device is structured to be capable of selectively emitting light with the second wavelength and a white color resulted from color mixture of light with the first and second wavelengths and light emitted from the fluorescent material.

In the light emitting device according to the present invention, the light with the first wavelength is not particularly limited and can be any light with a wavelength in a certain wavelength range. However, in view of providing a white color eventually, the light with the first wavelength is preferably light with a wavelength in the range of about 410 to 460 nm and ranges from UV light to blue light.

In this case, the first LED chip can be, for example, an ultraviolet LED chip containing a gallium-nitride based compound, a blue violet LED chip or a blue LED chip.

The light with the second wavelength is not particularly limited and can be any light with a wavelength in a certain wavelength range, similarly to the light with the first wavelength. However, in view of providing a white color eventually, the light with the second wavelength is preferably light with a wavelength in the range of about 590 to 1000 nm and ranges from orange light to infrared light.

In this case, the second LED chip can be, for example, an orange LED chip containing gallium arsenide phosphide, a red LED chip containing gallium aluminum arsenide or an infrared LED chip containing gallium arsenide.

The translucent sealing resin means a resin member for sealing the first and second LED chips for protecting them against external shocks and water in air. The sealing resin can be a translucent resin with excellent weather resistance, such as an epoxy resin, a silicone resin, a polyimide resin.

The fluorescent material contained in the sealing resin is not particularly limited and can be any fluorescent material which is excited by light with the first wavelength but is not excited by light with the second wavelength. However, in view of providing a white color eventually, the fluorescent material is preferably a fluorescent material which emits light with a wavelength in the range of about 500 to 590 nm when being excited by light with the first wavelength and includes a green fluorescent material and a yellow fluorescent material.

In this case, the fluorescent material can be a fluorescent material provided by using a base material, an activation material and a flux, wherein the base material can be a material selected from inorganic fluorescent materials such as oxides and sulfides of zinc, cadmium, magnesium, silicon, rare-earth elements such as yttrium, silicate, vanadate or organic fluorescent materials such as fluorescein, eosin, oils (mineral oils), the activation material can be a material selected from silver, cupper, manganese, chromium, europium, zinc, aluminum, lead, phosphorus, arsenic, gold, and the flux can be a material selected from sodium chloride, potassium chloride, magnesium carbonate, barium chloride.

In the light emitting device according to the present invention, the sealing resin may have a laminated-layer structure constituted by a first layer containing the fluorescent material and a second layer containing no fluorescent material, wherein the first LED chip may be provided such that its light emitting portion is positioned in the first layer, while the second LED chip may be provided such that its light emitting portion is positioned in the second layer.

In this structure, the light emitting portion of the second LED chip which does not contribute to the excitation of the fluorescent material is positioned in the second layer which does not contain the fluorescent material. Therefore, this structure prevents light emitted from the second LED chip from being kicked and obstructed by the fluorescent material, which enables emitting the light emitted from the second LED chip to the outside with higher efficiency.

The light emitting device according to the present invention may further include a base member having a concave portion for housing the first and second LED chips, and the boundary plane between the first layer and the second layer may be parallel to the bottom surface of the concave portion.

With this structure, it is possible to uniformize the distance from the light emitting portion of the first LED chip to the boundary plane between the first layer and the second layer, which can stabilize the characteristic of excitation of the fluorescent material, thereby suppressing the change of color shades depending on the direction of light emission.

In the light emitting device according to the present invention, the first LED chip may be a blue LED chip, the second LED chip may be a red LED chip, and the fluorescent material may be a yellow fluorescent material.

With this structure, it is possible to add components of red light to the pseudo white color resulted from the color mixture of the blue color and the yellow color, thereby generating a white color with an excellent color rendering characteristic.

Further, in this case, such a yellow fluorescent material may be, for example, a YAG (yttrium aluminum garnet) based fluorescent material.

In the light emitting device according to the present invention, the first LED chip may be a blue LED chip, the second LED chip may be a red LED chip, and the fluorescent material may be a green fluorescent material.

With this structure, it is possible to generate a white color with an excellent color rendering characteristic resulted from color mixture of a red color, a green color and a blue color.

Further, in this case, such a green fluorescent material may be, for example, a CSMS fluorescent material $(Ca_3(Sc.Mg)_2Si_3O_{12}:Ce)$.

In another respect, according to the present invention, there is provided a camera-equipped cellular phone including the aforementioned light emitting device according to the present invention as a secondary light source for use in photographing.

With the camera-equipped cellular phone according to the present invention, it is possible to utilize a white color with an excellent color rendering characteristic as a secondary light source for use in photographing and, also, it is possible to give an alarm to surroundings through the selectively-emitted light with the second wavelength, thereby preventing secret photographing.

The camera-equipped cellular phone according to the present invention may further include a control member for controlling the lighting of the light emitting device, and the control member may control the lighting of the first and second LED chips in such a way as to emit light with the second wavelength continuously or intermittently in a camera mode except during photographing.

With this structure, light with the second wavelength is emitted continuously or intermittently in the camera mode except during actual photographing, which can effectively notify surroundings of the fact that the cellular phone is in an activated state of some kind, thereby making the cellular phone preferable for preventing secret photographing.

In the aforementioned structure adapted to emit light with the second wavelength continuously or intermittently in the camera mode except during photographing, the control member may cause the first and second LED chips to emit light continuously when a request for lighting the secondary light source has been made in the camera mode except during photographing, but the control member may cause only the second LED chip to emit light continuously or intermittently while not causing the first LED chip to emit light when no request for lighting the secondary light source has been made.

With this structure, white light is continuously emitted when a request for lighting the secondary light source has been made in the camera mode, but light with the second wavelength is continuously emitted or blinked when no request for lighting the secondary light source has been made.

Accordingly, regardless of presence or absence of a request for lighting the secondary light source, it is possible to notify, through light, surroundings of the fact that the cellular phone is in an activated state of some kind in the camera mode, thereby offering the effect of preventing secret photographing.

In the aforementioned structure adapted to emit light with the second wavelength continuously or intermittently in the camera mode except during photographing, the control member may cause the first LED chip to emit light intermittently and also may cause the second LED chip to emit light continuously when a request for lighting the second light source has been made in the camera mode except during photographing. Further, the control member may cause only the second LED chip to emit light continuously or intermittently while not causing the first LED chip to emit light when no request for lighting the secondary light source has been made.

With this structure, white light and light with the second wavelength is alternately blinked when a request for lighting the secondary light source has been made in the camera mode, but light with the second wavelength is continuously emitted or blinked when no request for lighting the secondary light source has been made.

Accordingly, regardless of presence or absence of a request for lighting of the secondary light source, light with the second wavelength is emitted or blinked in the camera mode, thereby notifying surroundings of the fact that the cellular phone is in an activated state of some kind more actively, thereby offering an enhanced effect of preventing secret photographing.

Hereinafter, the present invention will be described in detail on the basis of the drawings. Further, in plural embodiments which will be described hereinafter, like reference numerals designate common components.

First Embodiment

A light emitting device according to a first embodiment of the present invention will be described, on the basis of FIG. 1 and FIG. 2.

Figure 1:
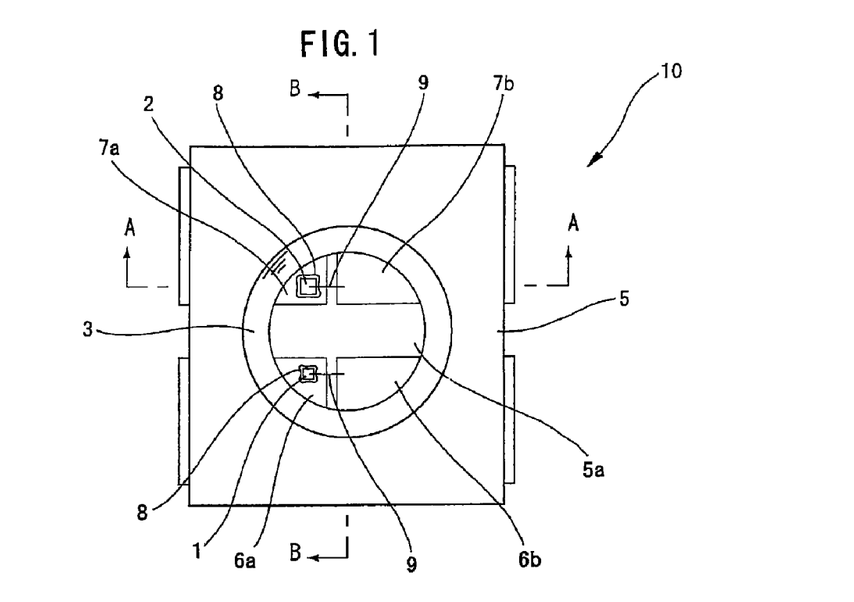
FIG. 1 is a plan view of a light emitting device according to a first embodiment of the present invention.
Figure 2:
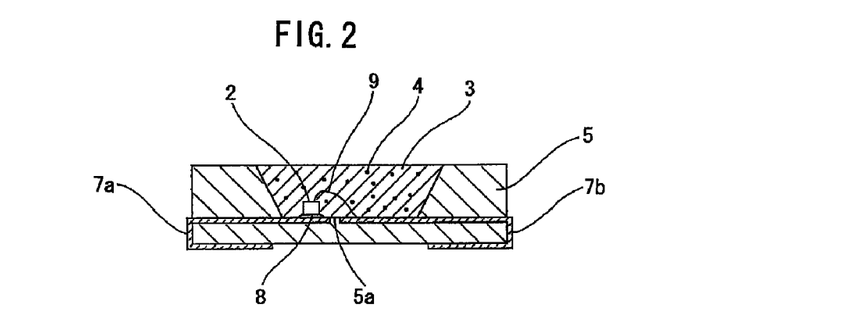
FIG. 2 is a cross-sectional view taken along A-A in FIG. 1.
Figure 3:
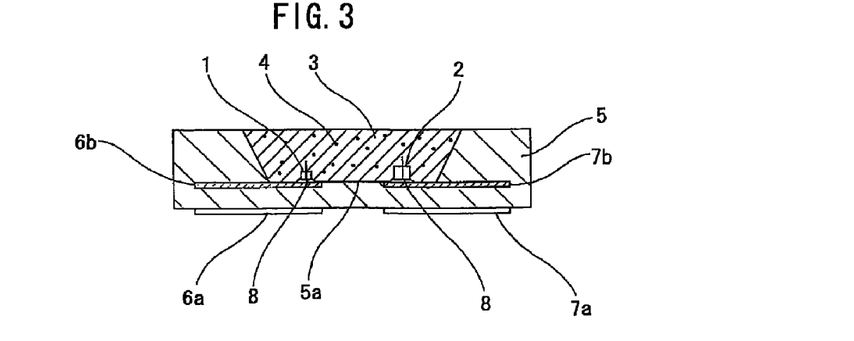
FIG. 3 is a cross-sectional view taken along B-B in FIG. 1.

FIG. 1 is a plan view of the light emitting device according to the first embodiment, FIG. 2 is a cross-sectional view taken along the line A-A in FIG. 1, and FIG. 3 is a cross-sectional view taken along the line B-B in FIG. 1.

As illustrated in FIGS. 1 to 3, the light emitting device 10 according to the first embodiment includes a blue LED chip 1 and a red LED chip 2 which emit light with a blue wavelength and light with a red wavelength, respectively, and further includes a translucent sealing resin 3 which seals the blue LED chip 1 and the red LED chip 2, wherein the sealing resin 3 contains a yellow fluorescent material 4 which is excited by light with blue wavelengths but is not excited by light with red wavelengths, so that the light emitting device 10 is structured to be capable of selectively emitting light with a red wavelength and white light resulted from color mixture of light with blue and red wavelengths and yellow light emitted from the yellow fluorescent material 4.

As illustrated in FIGS. 1 to 3, the blue LED chip 1 and the red LED chip 2 are housed in a concave portion 5a of a base member 5.

On the bottom of the concave portion 5a, in order to establish electric conduction between the blue LED chip 1 and the red LED chip 2, there are extended lead frames 6a, 6b and 7a, 7b made of cupper and plated with Ag such that they form pairs.

The base member 5 is made of a resin, and the lead frames 6a, 6b, 7a and 7b are provided integrally with the base member 5 through insert molding.

The blue LED chip 1 and the red LED chip 2 are mounted on one lead frames 6a and 7a with an Ag paste 8 interposed therebetween, such that their cathode electrodes (not illustrated) are faced to the lead frames 6a, 7a.

Also, in cases where their cathode electrodes are made of AuSn or Sn, an alloy layer can be formed on the lead frames 6a and 7a by heating and the blue LED chip 1 and the red LED chip 2 can be directly bonded thereto, without using the Ag paste 8.

With this structure, it is possible to make the heat transfer from the LED chips 1 and 2 to the lead frames 6a and 7a to be higher than in the case of using the Ag paste 8, thereby providing a structure with excellent reliability against heat generation.

On the other hand, the blue LED chip 1 and the red LED chip 2 are wire-bonded, at their anode electrodes (not illustrated), to the other lead frames 6b and 7b through metal wirings 9.

Accordingly, the blue LED chip 1 and the red LED chip 2 are electrically connected to the respective pairs of lead frames 6a, 6b and 7a, 7b.

The blue LED chip 1 and the red LED chip 2 which are electrically connected to each other are sealed by the sealing resin 3, since they are required to be protected against external shocks and water in air.

The sealing resin 3 is made of a transparent epoxy resin or silicone resin containing the yellow fluorescent material 4 dispersedly mixed therein. The concave portion 5a is filled with the sealing resin 3 such that the blue LED chip 1 and the red LED chip 2 which are electrically connected to each other are embedded therein.

The yellow fluorescent material 4 is excited by light with a blue wavelength emitted from the blue LED chip 1 to emit yellow light.

Accordingly, when the blue LED chip 1 and the red LED chip 2 are caused to emit light at the same time, blue light, yellow light and red light are emitted at the same time, which adds components of the red light to the pseudo white light resulted from the color mixture of the blue light and the yellow light, thereby generating white light with an improved color rendering characteristic.

Further, the aforementioned yellow fluorescent material 4 is not exited by the red light emitted from the red LED chip 2. Therefore, when only the red LED chip 2 is lighted, the light emitting device 10 emits only the red light.

As described above, the light emitting device 10 according to the first embodiment is capable of selectively emitting red light and white light with an improved color rendering characteristic resulted from color mixture of blue light, yellow light and red light only with the blue LED chip and the red LED chip, thereby attaining cost reduction due to the simplified structure and reduction of the mounting area due to the reduced size.

Second Embodiment

Figure 4:
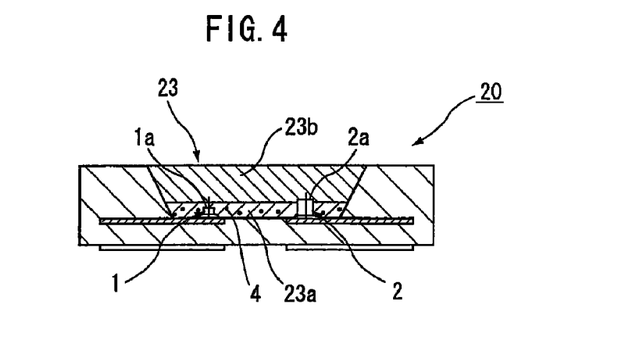
FIG. 4 is a cross-sectional view of a light emitting device according to a second embodiment of the present invention.

A light emitting device according to a second embodiment of the present invention will be described, on the basis of FIG. 4. FIG. 4 is a cross-sectional view of the light emitting device according to the second embodiment.

As illustrated in FIG. 4, the light emitting device 20 according to the second embodiment includes a sealing resin 23 having a laminated-layer structure constituted by a first layer 23*a* containing the yellow fluorescent material 4 and a second layer 23*b* containing no yellow fluorescent material 4, wherein a blue LED chip 1 is provided such that its light emitting portion 1*a* is positioned in the first layer 23*a*, while a red LED chip 2 is provided such that its light emitting portion 2*a* is positioned in the second layer 23*b*. The other structures are the same as those of the light emitting device 10 according to the aforementioned first embodiment.

In the light emitting device 20 according to the second embodiment, the red LED chip 2 which does not contribute to excitation of the yellow fluorescent material 4 is provided such that its light emitting portion 2*a* is positioned in the second layer 23*b* which contains no yellow fluorescent material 4, which prevents red light emitted from the red LED chip 2 from being kicked and obstructed by the fluorescent material 4. This can improve the efficiency of light emission.

While, in the aforementioned first and second embodiments, there have been described cases where the yellow fluorescent material 4 is employed as a fluorescent material, it is also possible to employ a green fluorescent material which is excited by light with blue wavelengths to emit green light, instead of the yellow fluorescent material 4, as a matter of cause.

In the case of employing such a green fluorescent material, instead of a yellow fluorescent material 4, it is possible to emit white light resulted from color mixture of red light, green light and blue light, which are three primary colors of light, the white light having a more excellent color rendering characteristic and being closer to natural light.

Further, while, in the aforementioned first and second embodiments, there have been exemplified the surface-mounting type light emitting devices 10 and 20, the concept of the present invention is not limited to surface-mounting types as described above and can be applied to light emitting devices in other aspects, such as cannonball-type light emitting devices.

Third Embodiment

Figure 5:
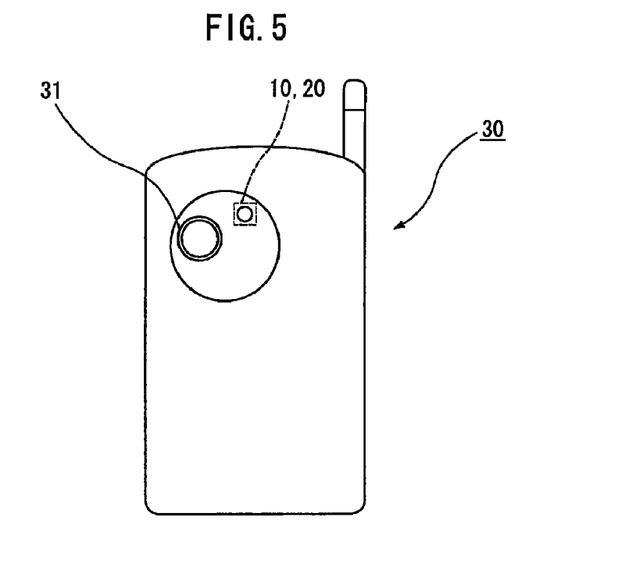
FIG. 5 is an explanation view of a camera-equipped cellular phone according to a third embodiment of the present invention.

In the third embodiment, the light emitting devices 10 and 20 according to the aforementioned first or second embodiment are mounted, as a secondary light source, in a camera-equipped cellular phone. FIG. 5 is an explanation view of the camera-equipped cellular phone according to the third embodiment.

As illustrated in FIG. 5, the camera-equipped cellular phone 30 according to the third embodiment includes a CCD camera 31 at a portion thereof and also includes, as a secondary light source, the light emitting devices 10 and 20 according to the aforementioned first or second embodiment which are mounted near the CCD camera 31.

As described above, the light emitting devices 10 and 20 according to the first or second embodiment are capable of selectively emitting while light or red light and, therefore, is capable of functioning as a secondary light source during photographing and, also, is capable of functioning as a red lamp indicating arrival of mails or phone calls or indicating that the cellular phone is being recharged.

Further, the light emitting devices 10 and 20 are set such that it blink red light in a camera mode except during actual photographing, which enables actively notifying surroundings of the fact that the camera-equipped cellular phone 30 is being in an activated state of some kind, thereby preventing secret photographing.

Figure 6:
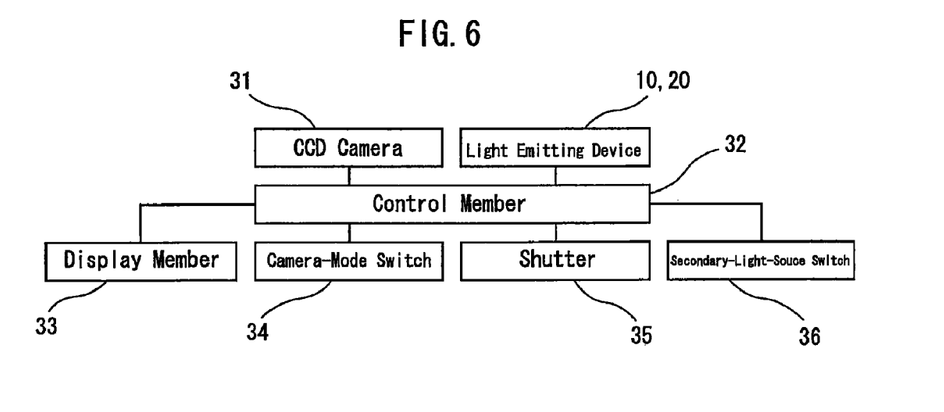
FIG. 6 is a block diagram of the camera-equipped cellular phone according to the third embodiment.

FIG. 6 is a block diagram of the camera-equipped cellular phone 30 according to the third embodiment.

As illustrated in FIG. 6, the CCD camera 31 and the light emitting devices 10 and 20 are driven and controlled by a control member 32. The control member 32 is also connected to a display member 33 for displaying images created by photographing, a camera-mode switch 34 which is operated by a user, a shutter 35 and a secondary light-source switch 36.

Figure 7:
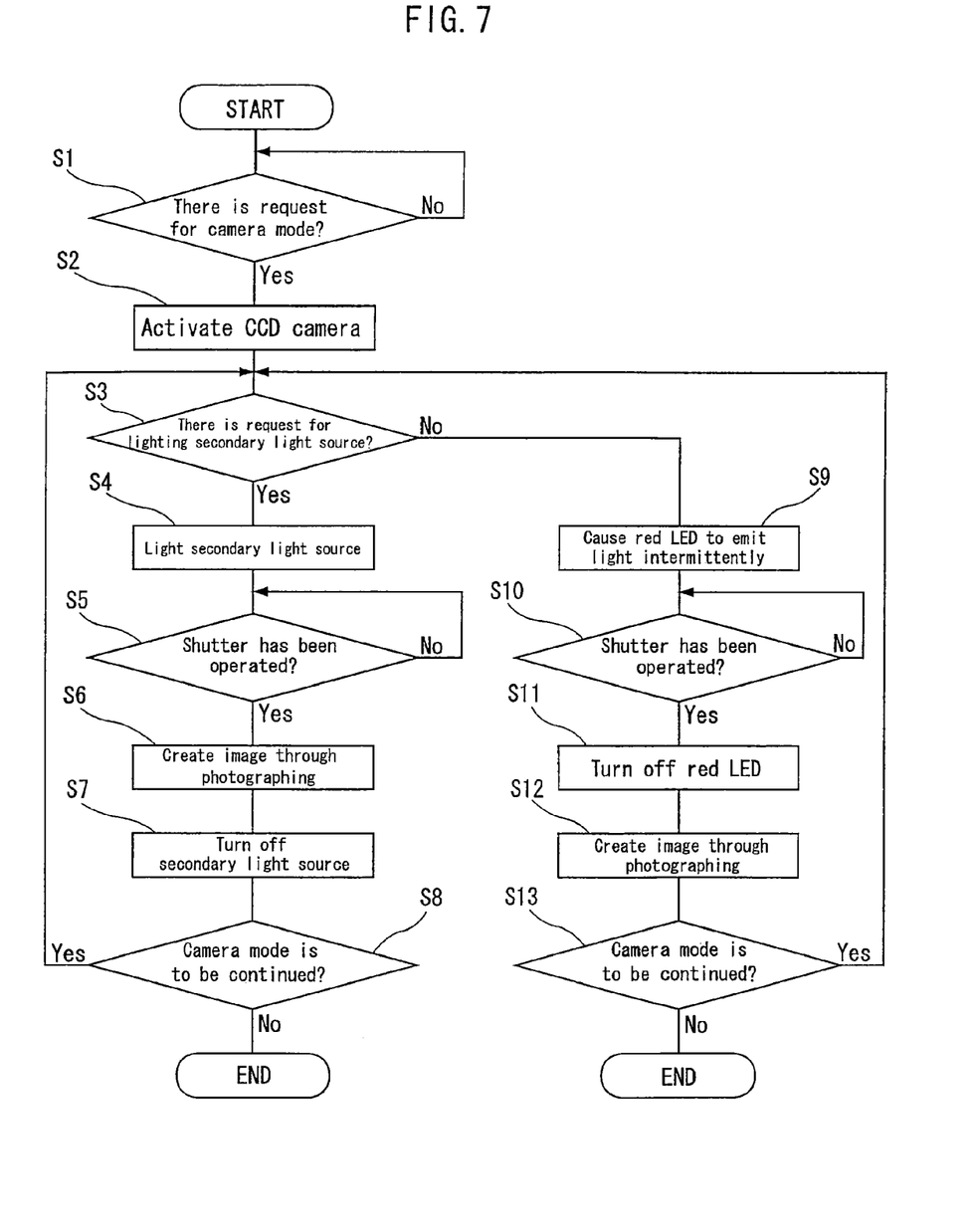
FIG. 7 is a flow chart illustrating a control flow of controlling of a light emitting device by a control member according to the third embodiment.

Hereinafter, there will be described a flow of controlling of the light emitting devices 10 and 20 by the control member 32, on the basis of a flow chart diagram illustrated in FIG. 7.

At first, it is determined whether or not a request for the camera mode has been made through the camera-mode switch 34 (step 1).

If step 1 results in a determination that a request for the camera mode has been made, the CCD camera 31 is activated to place the camera-equipped cellular phone 30 in the camera mode (step 2).

After the camera-equipped cellular phone 30 is placed in the camera mode in step 2, it is determined whether or not a request for lighting the secondary light source has been made through the secondary light-source switch 36 (step 3).

If step 3 results in a determination that a request for lighting the secondary light source has been made, the blue LED chip 1 and the red LED chip 2 are caused to emit light, thereby emitting white light as a secondary light source (step 4).

After the secondary light source is caused to emit light in step 4, it is determined whether or not the shutter 35 has been operated (step 5).

If step 5 results in a determination that the shutter 35 has been operated, the CCD camera 31 is caused to capture an image through photographing (step 6).

After the CCD camera 31 is caused to capture an image through photographing in step 6, the secondary light source is turned off (step 7) and, then, it is determined whether or not the camera mode is to be continued (step 8). If the camera mode is to be continued, the processing is returned to step 3. If the camera mode is not to be continued, the continuous flow is ended.

On the other hand, if step 3 results in a determination that no request for lighting the secondary light source has been made, the red LED chip 2 is caused to emit light intermittently (step 9).

After the red LED chip 2 is caused to emit light intermittently in step 9, it is determined whether or not the shutter 35 has been operated (step 10).

If step 10 results in a determination that the shutter 35 has been operated, the red LED chip 2 is caused to stop emitting light (step 11), and the CCD camera 31 is caused to capture an image through photographing (step 12).

After the CCD camera 31 is caused to capture an image through photographing in step 12, it is determined whether or not the camera mode is to be continued (step 13). If the camera mode is to be continued, the processing is returned to step 3. If the camera mode is not to be continued, the continuous flow is ended.

According to the aforementioned flow, if a request for lighting the secondary light source is made in the camera mode, white light is emitted, while if no request for lighting the secondary light source is made, red light is blinked except during actual photographing.

This can notify, through light, surroundings of the fact that the camera-equipped cellular phone 30 is being in an activated state of some kind, in the camera mode, thereby preventing secret photographing, regardless of the presence or absence of a request for lighting the secondary light source.

According to the aforementioned flow, red light is blinked only when no request for lighting the secondary light source has been made. However, it is also possible to blink red light, regardless of the presence or absence of a request for lighting. The flow of controlling in such a case will be described on the basis of FIG. 8.

Figure 8:
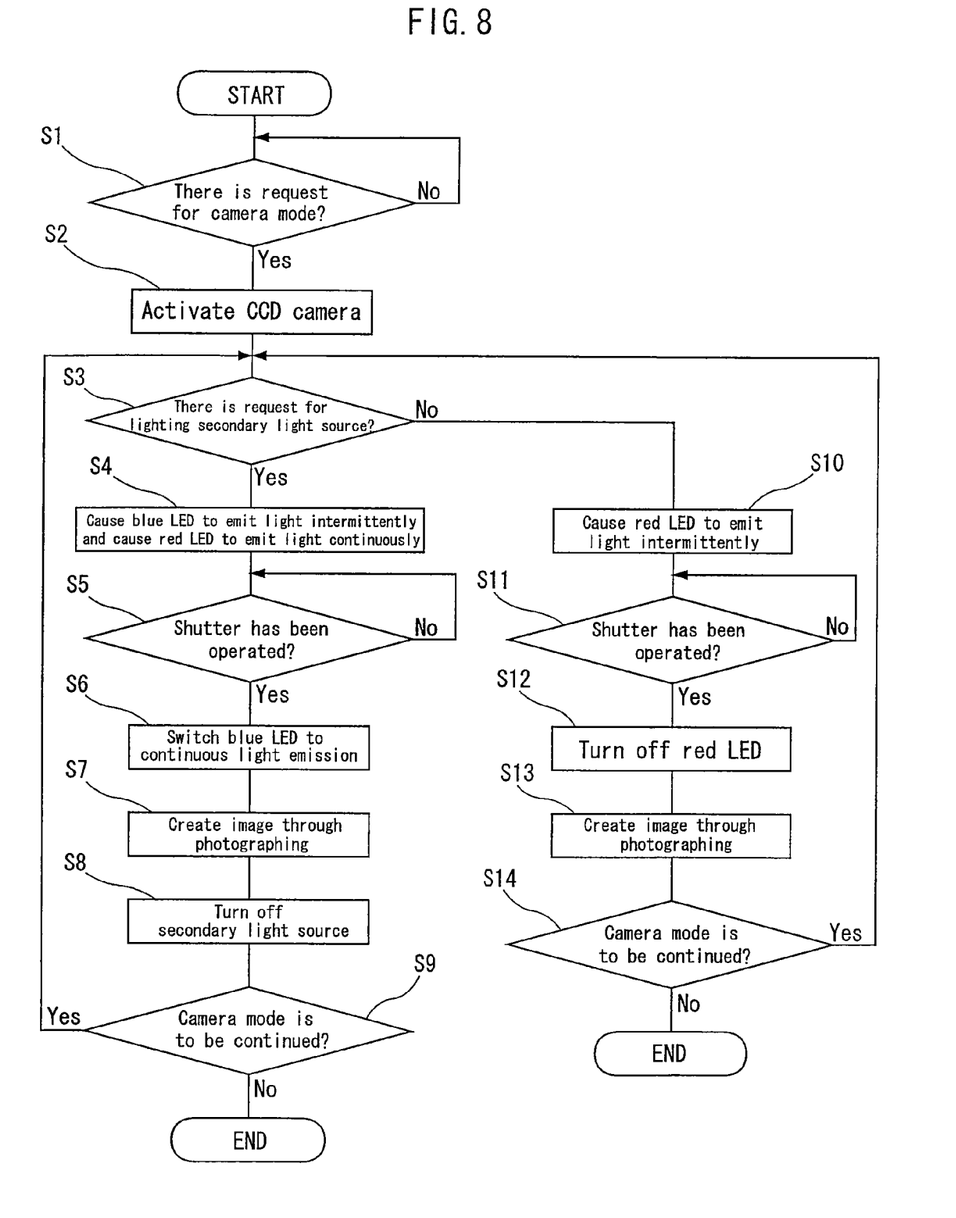
FIG. 8 is a flow chart illustrating a control flow of controlling of the light emitting device by the control member according to the third embodiment.

At first, it is determined whether or not a request for the camera mode has been made through the camera-mode switch 34 (step 1).

If step 1 results in a determination that a request for the camera mode has been made, the CCD camera 31 is activated to place the camera-equipped cellular phone 30 in the camera mode (step 2).

After the camera-equipped cellular phone 30 is placed in the camera mode in step 2, it is determined whether or not a request for lighting the secondary light source has been made through the secondary light-source switch 36 (step 3).

If step 3 results in a determination that a request for lighting the secondary light source has been made, the blue LED chip 1 is caused to emit light intermittently and, also, the red LED chip 2 is caused to emit light continuously (step 4).

When the blue LED chip 1 is caused to emit light intermittently and, also, the red LED chip 2 is caused to emit light continuously in step 4, namely, there is created a state where white light and red light are alternately blinked.

After the state where white light and red light are alternately blinked is created in step 4, it is determined whether or not the shutter 35 has been operated (step 5).

If step 5 results in a determination that the shutter 35 has been operated, the blue LED chip 1 is switched from intermittent light emission to continuous light emission to emit white light as the secondary light source (step 6), and the CCD camera 31 is caused to capture an image through photographing (step 7).

After the CCD camera 31 is caused to capture an image through photographing in step 7, the secondary light source is turned off (step 8) and, then, it is determined whether or not the camera mode is to be continued (step 9). If the camera mode is to be continued, the processing is returned to step 3. If the camera mode is not to be continued, the continuous flow is ended.

On the other hand, if step 3 results in a determination that no request for lighting the secondary light source has been made, the red LED chip 2 is caused to emit light intermittently (step 10).

After the red LED chip 2 is caused to emit light intermittently in step 10, it is determined whether or not the shutter 35 has been operated (step 11).

If step 11 results in a determination that the shutter 35 has been operated, the red LED chip 2 is caused to stop emitting light (step 12), and the CCD camera 31 is caused to capture an image through photographing (step 13).

After the CCD camera 31 is caused to capture an image through photographing in step 13, it is determined whether or not the camera mode is to be continued (step 14). If the camera mode is to be continued, the processing is returned to step 3. If the camera mode is not to be continued, the continuous flow is ended.

According to the aforementioned flow, red light is blinked in the camera mode except during actual photographing, regardless of the presence or absence of a request for lighting the secondary light source.

This can strongly notify surroundings of the fact that the secondary light source or the red-light LED in the camera-equipped cellular phone 30 are in an activated state of some kind, thereby enhancing the effect of preventing secret photographing.

While there has been exemplified the camera-equipped cellular phone 30 as an example of usage of the light emitting devices 10 and 20 according to the first and second embodiments, examples of usage of the light emitting devices 10 and 20 are not limited to usage with such a camera-equipped cellular phone 30, but they can be used as secondary light sources for digital cameras. Further, the light emitting devices 10 and 20 according to the first and second embodiments can be used as white/red light sources for various apparatuses utilizing the reduced cost and the smaller mounting area as described above.

What is claimed is:
1. A light emitting device comprising:
   first and second LED chips having first and second light emitting portions for emitting light with first and second wavelengths which are different from each other;
   a base member having a concave portion for housing the first and second LED chips therein; and
   a translucent sealing resin having a flat surface and sealing the first and second LED chips housed in the concave portion,
   wherein the sealing resin contains a fluorescent material which is excited by the light with the first wavelength but is not excited by the light with the second wavelength, so that the light with the second wavelength and white light resulted from the mixture of the light with the first and second wavelengths and light emitted from the fluorescent material can be selectively emitted, the concave portion having an inner flat bottom surface mounting the first and second LED chips thereon, the second LED chip being taller than the first LED chip so that an optical path length from the second light emitting portion to the surface of the sealing resin is shorter than that from the first light emitting portion to the surface of the sealing resin.

2. The light emitting device as set forth in claim 1, wherein the sealing resin has a laminated-layer structure including a first layer containing the fluorescent material and a second layer containing no fluorescent material, and the first LED chip is provided such that its light emitting portion is positioned in the first layer, while the second LED chip is provided such that its light emitting portion is positioned in the second layer.

3. The light emitting device as set forth in claim 2, wherein the boundary plane between the first layer and the second layer is parallel to the bottom surface of the concave portion.

4. The light emitting device as set forth in claim 1, wherein the first LED chip is a blue LED chip, the second LED chip is a red LED chip, and the fluorescent material is a yellow fluorescent material.

5. The light emitting device as set forth in claim 1, wherein the first LED chip is a blue LED chip, the second LED chip is a red LED chip, and the fluorescent material is a green fluorescent material.

6. A camera-equipped cellular phone comprising a light emitting device as a secondary light source for use in photographing, wherein the light emitting device comprises the light emitting devices as set forth in claim 1.

7. The camera-equipped cellular phone as set forth in claim 6, further comprising a control member for controlling the lighting of the light emitting device, wherein the control member controls the lighting of the first and second LED chips in such a way as to emit light with the second wavelength continuously or intermittently in a camera mode except during photographing.

8. The camera-equipped cellular phone as set forth in claim 7, wherein the control member causes the first and second LED chips to emit light continuously when a request for lighting the secondary light source has been made in the camera mode except during photographing, and the control member causes only the second LED chip to emit light continuously or intermittently while not causing the first LED chip to emit light when no request for lighting the secondary light source has been made in the camera mode except during photographing.

9. The camera-equipped cellular phone as set forth in claim 7, wherein the control member causes the first LED chip to emit light intermittently and also causes the second LED chip to emit light continuously when a request for lighting the secondary light source has been made in the camera mode except during photographing, and the control member causes only the second LED chip to emit light continuously or intermittently while not causing the first LED chip to emit light when no request for lighting the secondary light source has been made in the camera mode except during photographing.

10. The camera-equipped cellular phone as set forth in claim 7, wherein the control member controls the lighting of the first and second LED chips in such a way as to emit light with the second wavelength continuously or intermittently at the time of arrival of a mail or a phone call or during recharging.

* * * * *